United States Patent [19]

Elliott

[11] Patent Number: 5,367,476

[45] Date of Patent: Nov. 22, 1994

[54] FINITE IMPULSE RESPONSE DIGITAL FILTER

[75] Inventor: Paul M. Elliott, Jenner, Calif.

[73] Assignee: DSC Communications Corporation, Plano, Tex.

[21] Appl. No.: 32,931

[22] Filed: Mar. 16, 1993

[51] Int. Cl.⁵ .............................................. G06F 15/31
[52] U.S. Cl. ........................... 364/724.01; 364/724.13
[58] Field of Search .............. 364/724.01, 724.1, 724.2

[56] References Cited

U.S. PATENT DOCUMENTS

| | | | |
|---|---|---|---|
| 3,633,105 | 4/1972 | Lender et al. | 364/724.2 |
| 4,398,262 | 8/1983 | Williams | 364/724 |
| 4,791,597 | 12/1988 | Miron et al. | 364/724.03 |
| 4,805,129 | 2/1989 | David | 364/724.01 |
| 4,809,209 | 2/1989 | White | 364/724.16 |
| 4,853,969 | 8/1989 | Weideman | 382/54 |
| 4,893,265 | 1/1990 | Hirosaki | 364/724.10 |
| 4,953,118 | 8/1990 | Göckler | 364/724.01 |
| 5,050,119 | 9/1991 | Lish | 364/724.16 |
| 5,260,836 | 11/1993 | Yada et al. | 360/32 |

Primary Examiner—Roy N. Envall, Jr.
Assistant Examiner—Emmanuel Moise
Attorney, Agent, or Firm—Baker & Botts

[57] ABSTRACT

A finite impulse response filter (10) incorporates a two input data multiplexer (12) and a series of delay registers (18, 20, and 22) for processing input samples off an input data line (14). The data multiplexer (12) selects between a feedback sample generated at the last delay register (22) and an input sample received on the input data line (14). A multiplier (24) combines a coefficient as selected by a coefficient multiplexer (26) with the selected sample to drive an adder (28). The adder (28) sums sequential products from the multiplexer (24) to drive an accumulator register (30). The accumulator register (30) provides the adder (28) with the sum of products feedback in order that the adder (28) may sum successive products together. At the completion of a cycle, the data multiplexer (12) selects a new input sample off the input data line (14) and the adder (28) to accumulator register (30) combination is reset through a zero adjust generator (32).

12 Claims, 2 Drawing Sheets

FINITE IMPULSE RESPONSE DIGITAL FILTER

TECHNICAL FIELD OF THE INVENTION

This invention relates in general to digital signal processing technologies and more particularly to a finite impulse response digital filter.

BACKGROUND OF THE INVENTION

Finite impulse response (FIR) digital filters are widely used in digital signal processing. Conventional hardware realization of an FIR digital filter employs basic functional components such as delay units, multipliers, multiplexers, and adders. Conventional digital filter designs require a multitude of complex multipliers, multiplexers, and adders. The amount of basic functional components required for hardware realization of an FIR digital filter increases the cost and reduces the potential speed of the filter. Therefore, it is desirable to reduce the number and complexity of the basic functional components within an FIR digital filter.

From the foregoing it may be appreciated that a need has arisen for an FIR digital filter with a simplified design to reduce the cost and increase the speed for signal processing applications. A need has also arisen for an FIR digital filter with minimal component count and complexity for improved hardware realization effectiveness.

SUMMARY OF THE INVENTION

In accordance with the present invention, a finite impulse response filter is provided which substantially eliminates or reduces disadvantages and problems associated with conventional FIR digital filter designs.

The present invention includes a two input data multiplexer that selects between input samples and feedback samples from a series of delay registers. A multiplier combines the feedback samples from the delay registers with a selected coefficient. A two input adder combines the resulting product from the multiplier to previous products maintained in an accumulator register during a particular clock cycle. The output of the accumulator register is the filter output at the end of each clock cycle.

The FIR digital filter of the present invention provides for various technical advantages. For example, one technical advantage is in the implementation of a single two input data multiplexer, single multiplier, and single two input adder to achieve a desired sum of products despite the number of stages in the FIR digital filter. Another technical advantage is in the reduction of the number and complexity of basic functional components within the FIR digital filter. Yet another technical advantage is in the reduced cost and increased speed for an FIR digital filter. Other technical advantages are readily apparent to one skilled in the art from the following descriptions, figures, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
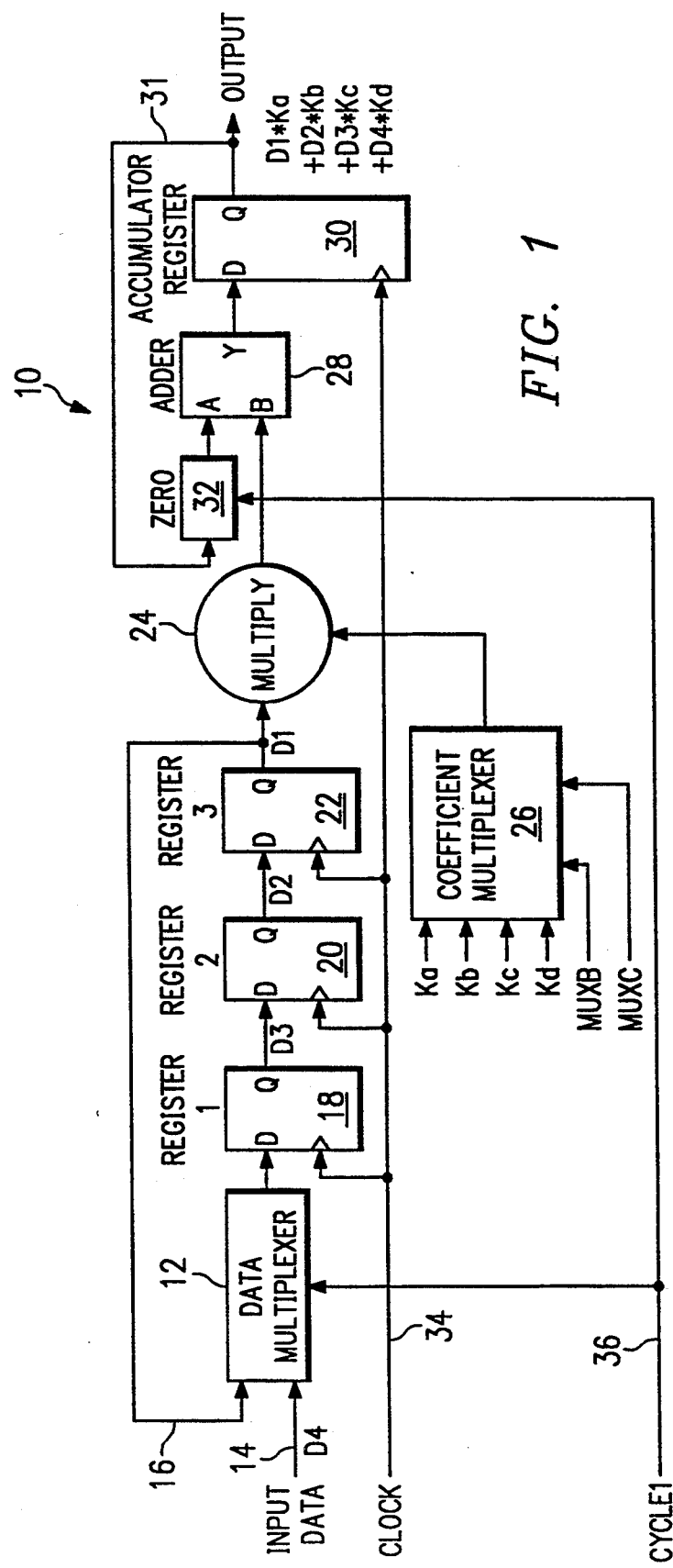
FIG. 1 illustrates a block diagram of a finite impulse response digital filter.

FIG. 1 is a block diagram of a finite impulse response (FIR) digital filter 10. FIR digital filter 10 includes a two input data multiplexer 12 that selects between an input sample signal 14 and a feedback sample signal 16. The sample signals may have single bit lengths or multiple bit lengths as desired. Data multiplexer 12 drives a series of delay registers 18, 20, and 22 that provide feedback signal 16. By using three delay registers, FIR digital filter 10 is shown as a four-stage filter. Multiple or lesser stage filters may be implemented by increasing or decreasing the number of delay registers as desired such that an N-stage filter has N−1 delay registers. For discussion purposes, FIR digital filter 10 is described using a four-stage implementation in order to illustrate one example of a possible filter design.

Delay register 22 generates feedback signal 16 for data multiplexer 12 and for a multiplier 24 in order to multiply feedback signal 16 with a given coefficient through a coefficient multiplexer 26. The resulting product of multiplier 24 drives one of the inputs of a two input adder 28. Adder 28 drives an accumulator register 30 that generates a filter output 31 that feeds back to a second input of adder 28 through a zero adjust generator 32. Accumulator register 30 generates the filter output 31 for FIR digital filter 10 at the completion of a specified clock cycle.

In operation, delay registers 18, 20, and 22 and accumulator register 30 are sampled by a clock signal 34. Data multiplexer 12 and zero adjust generator 32 are controlled by a cycle clock 36, where clock signal 34 is four times the rate of cycle clock 36 for the four stage filter example shown. The relationship between cycle clock 36 and clock signal 34 varies proportionately to the number of stages of FIR digital filter 10. At the beginning of a cycle as determined by cycle clock 36, data multiplexer 12 selects input sample signal 14 as the input to delay register 18. Cycle clock 36 also resets zero adjust generator 32 at the beginning of the cycle, causing zeros to be placed at input A of adder 28 instead of filter output 31 feedback from accumulator register 30. Each cycle occurring in cycle clock 36 is subdivided into four subcycles (for a four-stage filter) controlled by clock signal 34. Each subcycle sequentially shifts input samples from delay register 18 to delay register 20 to delay register 22 and circulates previous input samples over feedback sample signal 16 back through data multiplexer 12 to delay register 18. Thus, each subcycle places different input samples onto multiplier 24 for combination with a specific coefficient from coefficient multiplexer 26. Each result of multiplier 24 is sequentially added to previous results accumulated during previous subcycles by accumulator register 30 to produce filter output 31 at the completion of a cycle.

Figure 2:
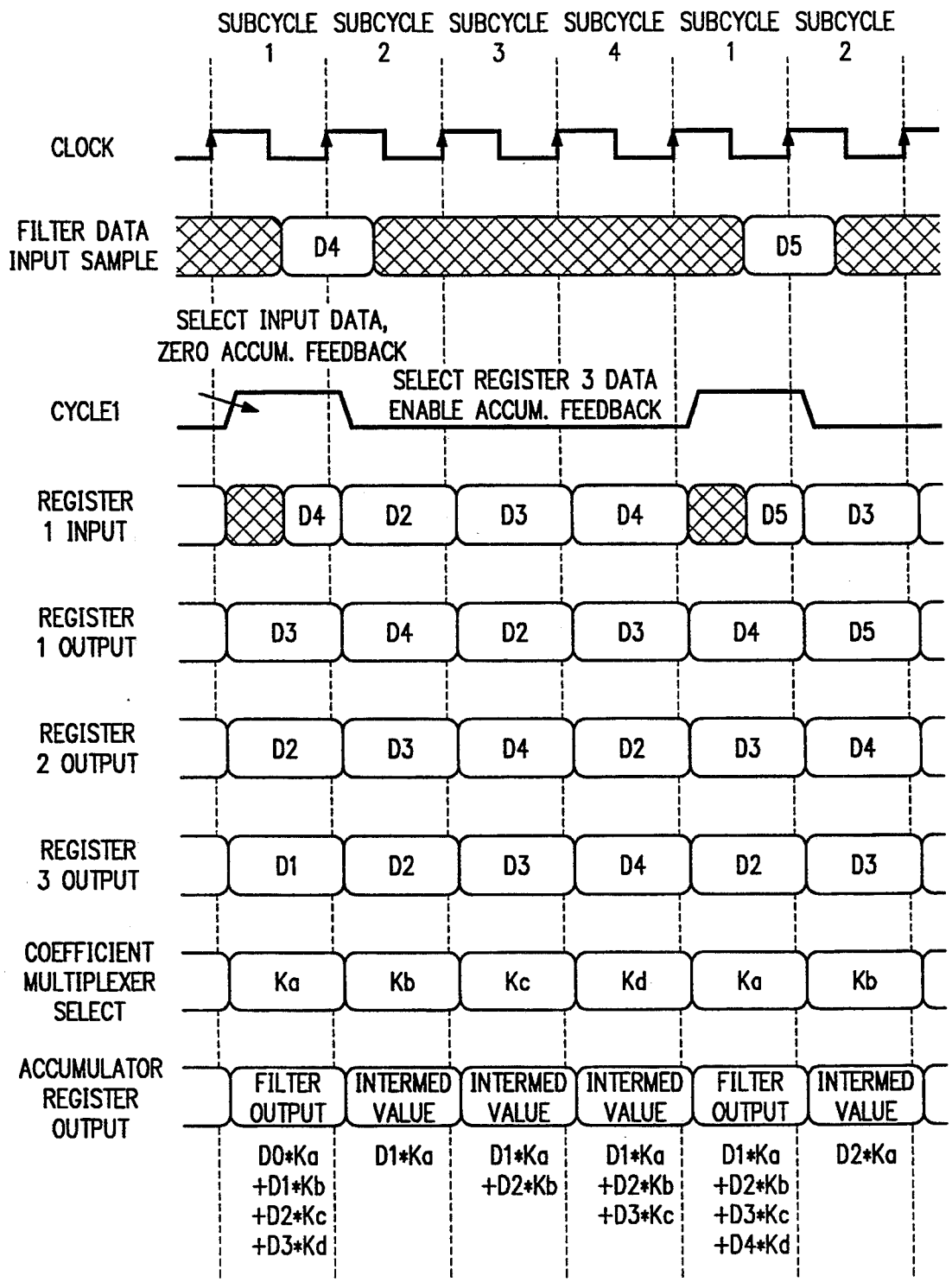
FIG. 2 illustrates a timing diagram for the preferred finite impulse response digital filter.

FIG. 2 is a timing diagram of FIR digital filter 10. The timing diagram shows the flow of data for a complete cycle of cycle clock 36 with four subcycles of clock signal 34. At the beginning of a cycle, data multiplexer 12 places input sample D4 from input sample signal 14 onto the input of delay register 18 in response to cycle clock 36. Similarly, zero adjust generator 32 places a zero signal onto input A of adder 28. Virtually simultaneously, delay registers 18, 20, and 22 place on their respective outputs previous input samples D3, D2, and D1 in response to subcycle 1. The output of delay register 22, D1, is combined with a coefficient Ka by multiplier 24 which places the product onto input B of adder 28 and adds the product to the zero value on input A, thus placing the product D1·Ka onto the input of accumulator register 30. At this point, filter output 31 of accumulator register 30 is the complete filter output for a previous cycle.

As clock signal 34 proceeds to subcycle 2, delay registers 18, 20, and 22 shift input samples D4, D3, and D2 onto their respective outputs. The input of accumulator register 30, D1·Ka, shifts to filter output 31. Data multiplexer 12 now selects the sample from delay register 22 on feedback sample signal 16, which is sample D2, and places sample D2 onto the input of delay register 18. The output of delay register 22, D2, is combined by multiplier 24 with the next coefficient Kb selected by coefficient multiplexer 26. The resulting product D2·Kb placed onto input B of adder 28 is summed with filter output 31 feedback, D1·Ka, at input A of adder 28 and the sum of products (D1·Ka+D2·Kb) is placed at the input of accumulator register 30.

As clock signal 34 proceeds to subcycle 3, input sample D2 on feedback sample signal 16 is placed on the output of delay register 18 and input samples D4 and D3 sequence to the outputs of delay registers 20 and 22, respectively. Accumulator register 30 also places the sum of products (D1·Ka+D2·Kb) from its input onto filter output 31. The output of delay register 22, D3, is fed back on feedback sample signal 16 through data multiplexer 12 onto the input of delay register 18. Feedback sample D3 is also combined by multiplier 24 with the next coefficient Kc selected by coefficient multiplexer 26 and the resulting product D3·Kc is placed onto the input B of adder 28. The sum of products (D1·Ka+D2·Kb) on filter output 31 from accumulator register 30 is fed back to input A of adder 28 to create the next sum of products input (D1·Ka+D2·Kb+D3·Kc) to accumulator register 30.

As clock signal 34 proceeds to subcycle 4, delay registers 18, 20, and 22 take the input samples D3, D2 and D4 on their respective inputs and place them on their respective outputs. Accumulator register 30 places the next sum of products (D1·Ka+D2·Kb+D3·Kc) from its input onto filter output 31. The new output of delay register 22, D4, is placed on the input of delay register 18 by feedback sample signal 16 and data multiplexer 12. Delay register 22 output D4 is combined by multiplier 24 with the next coefficient Kd by coefficient multiplexer 26 and the resulting product D4·Kd is placed on input B of adder 28. Adder 28 sums the resulting product D4·Kd with the sum of products (D1·Ka+D2·Kb+D3·Kc) fed back on filter output 31 and places the next sum of products (D1·Ka+D2·Kb+D3·Kc+D4·Kc) onto the input of accumulator register 30.

Upon the start of a next cycle, data multiplexer 12 places a new input sample, D5, onto the input of delay register 18. The next subcycle clock places input samples D4, D3, and D2 onto the outputs of delay registers 18, 20, and 22, respectively. Because data multiplexer 12 now selects the input sample on input sample signal 14, delay register 22 output D2 does not feed back onto the input of delay register 18. The next subcycle also places the sum of products (D1·Ka+D2·Kb+D3·Kc+D4·Kd) onto filter output 31 of accumulator register 30, producing the final filter output of FIR digital filter 10 for the previous cycle. FIR digital filter 10 continues in this fashion for the next cycle and subcycles.

Table I shows the path of six filter input samples D0 to D5 where D0 is the oldest sample and D5 is the newest sample for three complete cycles. The column titles correspond as follows:

Sample=Input sample on input sample signal 14
Subcycle=clock signal 34 timing
R1D=Register 1 input Delay register 18 input
R1Q=Register 1 output Delay register 18 output
R2Q=Register 2 output Delay register 20 output
R3Q=Register 3 output Delay register 22 output
K=Selected Coefficient
ADDA=Adder input A
ADDB=Adder input B
Post-clock Accumulator=Filter output 31 at completion of cycle.

TABLE I

| Sample | Sub-cycle | R1D | R1Q | R2Q | R3Q | K  | ADDB   | ADDA                              |
|--------|-----------|-----|-----|-----|-----|----|--------|-----------------------------------|
| D3     | 1         | D3  | D2  | D1  | D0  | Ka | D0*Ka  | 0                                 |
|        | 2         | D1  | D0  | D2  | D1  | Kb | D1*Kb  | (D0*Ka)                           |
|        | 3         | D2  | D1  | D3  | D2  | Kc | D2*Kb  | (D0*Ka) + (D1*Kb)                 |
|        | 4         | D3  | D2  | D1  | D3  | Kd | D3*Kd  | (D0*Ka) + (D1*Kb) + (D2*Kc)       |
| Post-clock Accumulator: (D0*Ka) + (D1*Kb) + (D2*Kc) + (D3*Kd) ||||||||
| D4     | 1         | D4  | D3  | D2  | D1  | Ka | D1*Ka  | 0                                 |
|        | 2         | D2  | D4  | D3  | D2  | Kb | D2*Kb  | (D1*Ka)                           |
|        | 3         | D3  | D2  | D4  | D3  | Kc | D3*Kb  | (D1*Ka) + (D2*Kb)                 |
|        | 4         | D4  | D3  | D2  | D4  | Kd | D4*Kd  | (D1*Ka) + (D2*Kb) + (D3*Kc)       |
| Post-clock Accumulator: (D1*Ka) + (D2*Kb) + (D3*Kc) + (D4*Kd) ||||||||
| D5     | 1         | D5  | D4  | D3  | D2  | Ka | D2*Ka  | 0                                 |
|        | 2         | D3  | D5  | D4  | D3  | Kb | D3*Kb  | (D2*Ka)                           |
|        | 3         | D4  | D3  | D5  | D4  | Kc | D4*Kb  | (D2*Ka) + (D3*Kb)                 |
|        | 4         | D5  | D4  | D3  | D5  | Kd | D5*Kd  | (D2*Ka) + (D3*Kb) + (D4*Kc)       |
| Post-clock Accumulator: (D2*Ka) + (D3*Kb) + (D4*Kb) + (D5*Kd) ||||||||

Coefficients are shown to be sequentially selected in response to each subcycle. Though coefficient multiplexer 26 may be driven by signals decoded from clock signal 34, coefficients may be selected in any desired manner.

In summary, a finite impulse response digital filter reduces component count by incorporating feedback through a two input multiplexer to achieve a desired sum of products. Feedback of accumulated sums of products allow for the use of a single multiplier and single two input adder. The number of stages in the filter design may be changed without affecting the multiplexer, multiplier, or adder and without significantly increasing the number of interconnections within the filter design.

Thus, it is apparent that there has been provided, in accordance with the present invention, a finite impulse response filter that satisfies the advantages set forth above. Although the preferred embodiment has been described in detail, it should be understood that various changes, substitutions, and alterations can be made herein without departing from the spirit and scope of the present invention as defined by the following claims.

What is claimed is:

1. A finite impulse response filter, comprising:
   a data multiplexer for selecting a sample signal;
   a coefficient multiplexer for selecting one of a plurality of coefficients;
   a multiplier for multiplying a selected coefficient to said selected sample signal to obtain a resulting product;
   an adder for summing said resulting product to a previous result product to obtain a sum of products;
   an accumulator register for latching said sum of products, wherein said adder receives said latched sum of products and adds said latched sum of products to said resulting product; and
   a zero adjust generator for resetting said adder and providing said adder with said latched sum of products.

2. The filter of claim 1, further comprising: a register for generating a feedback sample signal by latching said selected sample signal.

3. The filter of claim 2, wherein said multiplier combines said feedback sample signal to said selected coefficient to obtain said resulting product.

4. The filter of claim 3, wherein said data multiplexer receives said feedback sample signal from said register and an input sample signal, said multiplexer selecting between said feedback sample signal and said input sample signal.

5. The filter of claim 1, wherein said zero adjust generator generates a zero value signal for resetting said adder, said zero adjust generator selecting between said latched sum of products and said zero value signal.

6. A finite impulse response digital filter, comprising:
   a data multiplexer for routing a sample signal selected from an input sample signal and a feedback sample signal;
   a plurality of delay registers connected in series for latching sequential sample signals, said plurality of delay registers including a first register for generating said feedback sample signal and a second register for receiving said selected sample signal from said data multiplexer;
   a coefficient multiplexer for selecting one of a plurality of coefficients;
   a multiplier for generating a product of said selected sample signal and a selected coefficient;
   an adder for combining said product with previous products to obtain a sum of products;
   an accumulator register for latching said sum of products, wherein said adder receives said latched sum of products, said adder combining successive products with said latched sum of products to obtain successive sums of products; and
   a zero adjust generator for resetting said adder by generating a zero value signal, said zero adjust generator determining whether said adder receives said latched sum of products or said zero value signal.

7. The filter of claim 6, wherein said data multiplexer and said zero adjust generator are controlled by a cycle clock signal, said cycle clock signal defining a cycle of the filter, said accumulator register generating a filter output from said latched sum of products at completion of said cycle.

8. The filter of claim 7, wherein said plurality of delay registers and said accumulator register are controlled by a subcycle clock signal derived from said cycle clock.

9. The filter of claim 8, wherein a number of pulses of said subcycle clock signal within one pulse of said cycle clock signal is equivalent to a number of stages of the filter.

10. The filter of claim 9, wherein a number of registers is one less than said number of stages.

11. A method of filtering data, comprising the steps of:
   sequentially latching successive samples to generate successive feedback samples for a desired cycle time;
   selecting between an input sample and said feedback samples prior to said latching step;
   multiplying each feedback sample with a selected coefficient to obtain a resulting product;
   adding said resulting product to a previous resulting product to obtain a sum of products;
   latching said sum of products to generate a filter output at completion of said desired cycle time;
   circulating said sum of products such that said adding step combines successive resulting products to said sum of products to obtain successive sum of products; and
   resetting said adding step at initiation of said desired cycle time by adding a zero value signal instead of a previous sum of products to a first resulting product.

12. The method of claim 11, wherein said input sample is selected at initiation of a cycle.

* * * * *